(12) United States Patent
Tsai

(10) Patent No.: US 6,645,808 B1
(45) Date of Patent: Nov. 11, 2003

(54) METHOD AND DEVICE FOR PROVIDING DOUBLE CELL DENSITY IN SDRAM AND IN DDR SDRAM

(75) Inventor: Ming Shiahn Tsai, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/272,312

(22) Filed: Oct. 15, 2002

(51) Int. Cl.$^7$ .......................................... H01L 21/8242
(52) U.S. Cl. ...................................... 438/243; 438/248
(58) Field of Search ................................ 438/243–249, 438/386–392

(56) References Cited

U.S. PATENT DOCUMENTS

| | | | |
|---|---|---|---|
| 6,184,090 B1 | 2/2001 | Lin | |
| 6,271,081 B2 * | 8/2001 | Kajiyama | 438/243 |
| 6,418,050 B2 * | 7/2002 | Forbes | 365/177 |

* cited by examiner

Primary Examiner—Jey Tsai
(74) Attorney, Agent, or Firm—Townsend and Townsend and Crew LLP

(57) ABSTRACT

Method and device for providing double cell density in synchronous dynamic random access memory (SDRAM) and in double data rate synchronous dynamic random access memory (DDR SDRAM) are disclosed. In specific embodiments, a conventional photolithography technology is used to define a cell area on a semiconductor substrate and then a trench capacitor is formed in the cell area. After that, an array device active area is defined on the cell area and STIs are formed beside the array device active area in the semiconductor substrate. Next, a polysilicon layer is subsequently deposited, photolithographed and anisotropically etched to form an array device polysilicon layer. A gate oxide layer, a gate conductive layer and a gate cap are subsequently formed on the semiconductor substrate and cell area according to the following steps in specific embodiments. A silicon oxide layer, a polysilicon layer and a nitride layer are subsequently deposited on the semiconductor substrate and cell area and then the horizontal portions of the three layers above STI are removed by anisotropic etching. A contact window is formed on the top of the array device polysilicon layer. The top of the array device polysilicon layer is doped with ion implantation through the contact window. Finally, the contact window is filled with polysilicon to form a contact plug.

21 Claims, 5 Drawing Sheets

METHOD AND DEVICE FOR PROVIDING DOUBLE CELL DENSITY IN SDRAM AND IN DDR SDRAM

BACKGROUND OF THE INVENTION

The present invention relates generally to a method for fabricating Dynamic Random Access Memory (DRAM), and more particularly, to method and device for providing double cell density in Synchronous Dynamic Random Access Memory (SDRAM) and in Double Data Rate Synchronous Dynamic Random Access Memory (DDR SDRAM).

Dynamic random access memory (DRAM) is an important device, which saves digital data. A synchronous dynamic random access memory (SDRAM) is one kind of DRAM that is synchronized with operation speed and clock signal. Heretofore, in order to further improve the operation speed, a concept of a double data rate (DDR) synchronous dynamic random access memory (SDRAM) has been extensively used. A conventional SDRAM employs only a rising edge of a clock signal, while the DDR SDRAM employs both rising and falling edges of the clock signal.

A conventional trench type device is used in the SDRAM or DDR SDRAM as a capacitor. FIG. 1 shows a cross-sectional diagram of a trench type DRAM according to the prior art. The trench type DRAM was formed on semiconductor substrate 10. Each trench type DRAM contains a p-type well 12, a trench capacitor 14, shallow trench isolation (STI) 16, a buried strap 18, a word line 20 and a contact window 22. Particularly, the word line 20 such as a sandwich structure contains a polysilicon layer 20a, a tungsten silicide layer 20b and a silicon nitride 20c from bottom to top. The difficulties of integration DRAM fabricating process, as shown in FIG. 1, are that either the size of conventional trench type DRAM which needs large area to store more charge is hard to scale down or the fabrication cost of trench type DRAM cannot be decreased.

Generally, data retention time and device reliability are two major issues in DRAM fabrication. Lowering leakage current of DRAM and raising cell density are two primary targets for DRAM fabrication under the circumstance, which varies fewer process steps and applies the existing IC technology.

On the other hand, a vertical MOS has been applied in wireless communication such as that disclosed in U.S. Pat. No. 6,184,090, entitled "Fabrication Method For a Vertical Transistor" by United Microelectronics Corporation (UMC), but the vertical MOS device is not applied yet in DRAM fabrication. The vertical MOS device is formed on a semiconductor substrate 30. Referring to FIG. 2, each vertical MOS device contains a STI 32 (shallow trench isolation), a first doping layer 34, a second doping layer 36, a third doping layer 38, a gate oxide layer 40, a gate conductive layer 42 and a dielectric layer 44.

BRIEF SUMMARY OF THE INVENTION

Embodiments of the present invention are directed to devices and methods for providing double cell density in SDRAM and in DDR SDRAM.

An aspect of the present invention is directed to a method for providing double cell density in SDRAM and in DDR SDRAM. First, a conventional photolithography technology is used to define a cell area on a semiconductor substrate. An array device active area is defined on the cell area and STIs are formed beside the array device active area in the semiconductor substrate. A trench capacitor is subsequently formed in the array device active area. Next, a polysilicon layer is subsequently deposited, photolithographed and anisotropically etched to form an array device on the trench capacitor.

A gate oxide layer, a gate conductive layer and a gate cap are subsequently formed on the array device polysilicon layer according to following steps. A silicon oxide layer is thermally oxidized, a polysilicon/tungsten-silicide layer and a gate cap layer are subsequently deposited on the semiconductor substrate and then the horizontal portions of the three layers on STI are removed by the procedure of anisotropic etching. A contact window is formed on the polysilicon layer of the array device active area. The top portion of the array device active area is doped with ion implantation through the contact windows. Finally, the contact window is filled with polysilicon to form a contact plug.

In accordance with another aspect of the present invention, a device is provided with double cell density in SDRAM and in DDR SDRAM. A SDRAM or a DDR SDRAM is set on a cell area of a semiconductor substrate. STIs are formed beside the array device cell area in the semiconductor substrate. Each SDRAM or DDR SDRAM contains a trench capacitor and an array device. Particularly, the array device on the cell area comprises an array device polysilicon layer, a gate oxide layer, a gate conductive layer, a gate cap and a contact plug. The trench capacitor is set in the array device active area of the semiconductor substrate. In other words, the upper edge or level of the trench capacitor substantially coincides with that of the substrate surface. Furthermore, the trench capacitor contains a trench, an oxide-nitride layer, a first polysilicon layer, an oxide layer, a second polysilicon layer and a buried strap. Particularly, the trench is set in the array device active area of the semiconductor substrate. The oxide-nitride layer formed along the shape (bottom and sidewall) of the lower portion (e.g., lower half) of the trench is set on the lower portion of the trench. The lower portion of the trench is then filled with the first polysilicon layer surrounded by the first oxide layer. The oxide layer formed along the upper portion sidewall of the trench is set on the first oxide layer and a part of the first polysilicon layer. After that, the second polysilicon layer surrounded by the second oxide layer is set on top of the first polysilicon layer. More particularly, the upper edge or level of the second polysilicon layer is higher than that of the oxide layer. The buried strap which fills the rest of the trench is then set on the oxide layer and the second polysilicon layer. The upper edge or level of buried strap substantially coincides with that of said semiconductor substrate.

In the vertical MOS device, the trench capacitor of the cell area is covered with the array device polysilicon layer of the array device. The gate oxide layer is set upon the array device polysilicon layer of the array device active area and the gate conductive layer is set upon the gate oxide layer. Finally, the gate conductive layer as a word line comprised of polysilicon/tungsten-silicide is covered with the gate cap, which contains a gate nitride layer. An insulating spacer set on sidewall of the gate oxide layer, the gate conductive layer and the gate cap layer and adjacent to the contact plug. The contact plug comprised of polysilicon is set on the array device polysilicon layer of the array device active area. A doping area which is the bottom of the contact plug connects the array device polysilicon layer of the array device active area and also tunnels the gate oxide layer, the gate conductive layer and the gate cap.

DETAILED DESCRIPTION OF THE INVENTION

The present invention relates generally devices and methods for providing double cell density in SDRAM and in DDR SDRAM. The present invention improves upon prior trench type DRAM technology and prior array device technology to form double cell density in SDRAM and in DDR SDRAM. The DRAM fabricated from the present invention can double the DRAM cell density and also decrease the current leakage.

Figure 1:
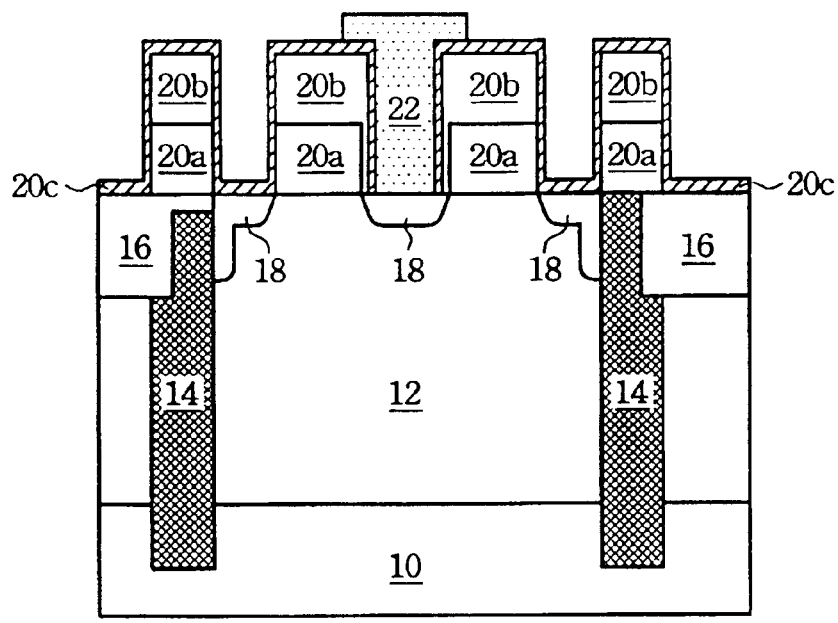
FIG. 1 is a cross-sectional diagram of the trench cell capacitor of DRAM according to the prior art.
Figure 2:
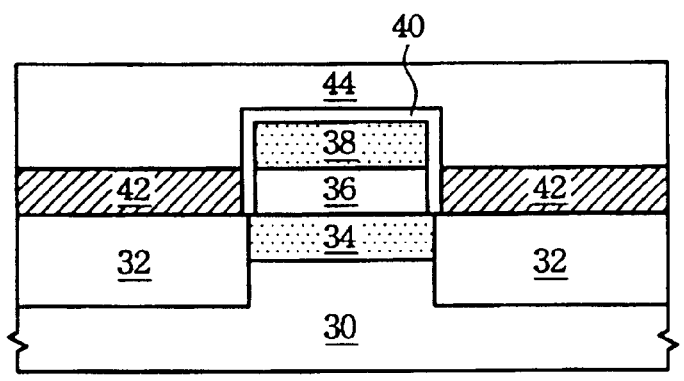
FIG. 2 is a cross-sectional diagram of the vertical MOS according to the prior art.
Figure 3:
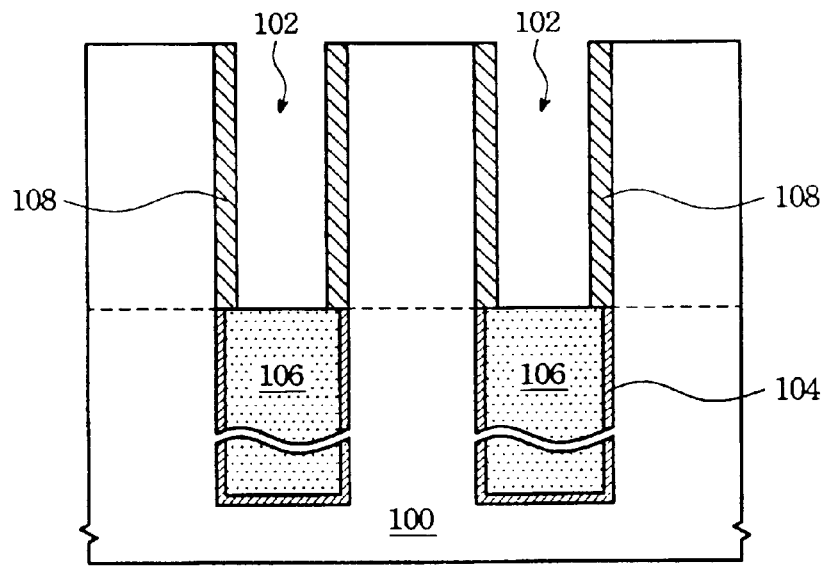
FIG. 3 is a cross-sectional diagram illustrating a process of forming the deep trench and the second oxide layer according to an embodiment of the present invention.

An exemplary method for double cell density in SDRAM and in DDR SDRAM is described as follows. First referring to FIG. 3, a semiconductor substrate 100 comprised of single crystalline silicon is provided. A photoresist layer (not shown) is coated on a semiconductor substrate 100 to define a cell area (not shown) through a conventional photolithography technology. A deep trench 102 is then formed in the cell area by a conventional anisotropic etching technology. The term "deep trench" is used to refer to a trench that is typically about 5 $\mu$m–10 $\mu$m deep, but the depth may vary depending on the structure. After that, an oxide-nitride layer 104 is formed by depositing a nitride layer in the deep trench 102 then oxidizing the nitride layer. Next, a heavily doped first polysilicon layer 106 surrounded by the oxide-nitride layer 104 is formed in the deep trench 102 via a CVD process and an anisotropic process. The first polysilicon layer 106 is heavily doped with, for instance, As or P of about 5E12 $cm^{-2}$–6E15 $cm^{-2}$. The range is merely an example for illustrative purposes only. An oxide layer is deposited on the first oxide layer 104 and the first polysilicon layer 106 via a CVD process. An oxide layer 108 is formed after an anisotropic etching process is performed to remove the horizontal portion of the oxide layer as shown in FIG. 3.

Figure 4:
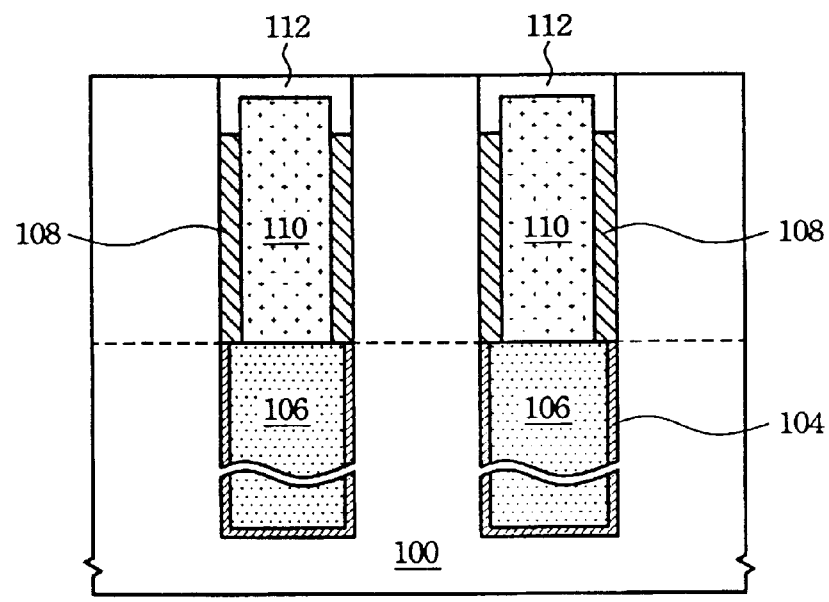
FIG. 4 is a cross-sectional diagram, illustrating a process of forming the trench capacitor according to an embodiment of the present invention.

As shown in FIG. 4, a trench capacitor is formed completely. First, in a deep trench, a lightly doped polysilicon layer is deposited on the oxide-nitride layer 104 and the first polysilicon layer 106 via a CVD process. The range is merely an example for illustrative purposes only. Next, a second polysilicon layer 110 is formed after the lightly-doped polysilicon layer is etched back via a conventional plasma etching process or a conventional CMP (chemical mechanical polishing) process. The second polysilicon layer 110 is lightly doped with, for instance, As or P of about 1E11 $cm^{-2}$–5E13 $cm^{-2}$. The oxide layer 108 is formed after an anisotropic etching process is performed to remove the top of the oxide layer 108 as shown in FIG. 4. A buried strap 112 comprised of doped polysilicon (e.g., doped with As or P) is then formed on the oxide layer 108 and the second polysilicon layer 110 via a CVD process and a CMP process.

It should be understood that the foregoing relates to only preferred trench capacitors of the present invention, and that it is intended to cover all changes and modifications of the capacitors of the invention herein used for the purposes of the disclosure, which do not constitute departures from the spirit and scope of the invention.

Figure 5:
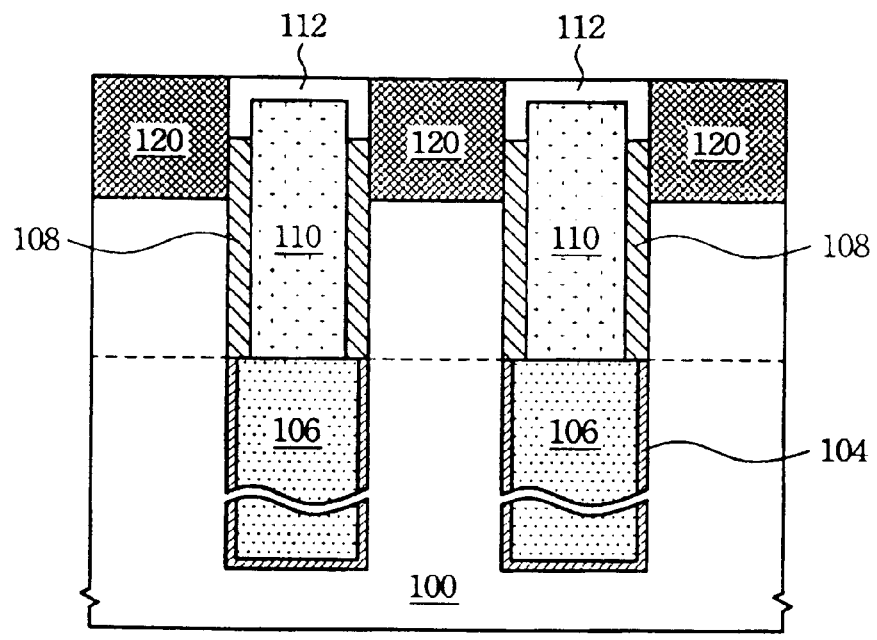
FIG. 5 is a cross-sectional diagram illustrating a process of forming the STIs according to an embodiment of the present invention.

Next referring to FIG. 5, STIs 120 are formed beside the array device active area. The STI forming process comprises the following steps. A photoresist (not shown) is coated on the semiconductor substrate 100 to define the areas of the STIs 120 via a conventional photolithography process. After that, shallow trenches are formed in the areas of the STIs 120 via a conventional anisotropic etching process. A CVD process is used to deposit a silicon oxide layer in the shallow trenches and on the semiconductor substrate. A CMP process is then applied to remove the silicon oxide on the semiconductor substrate 100. This completes the formation of the STIs 120.

Figure 6:
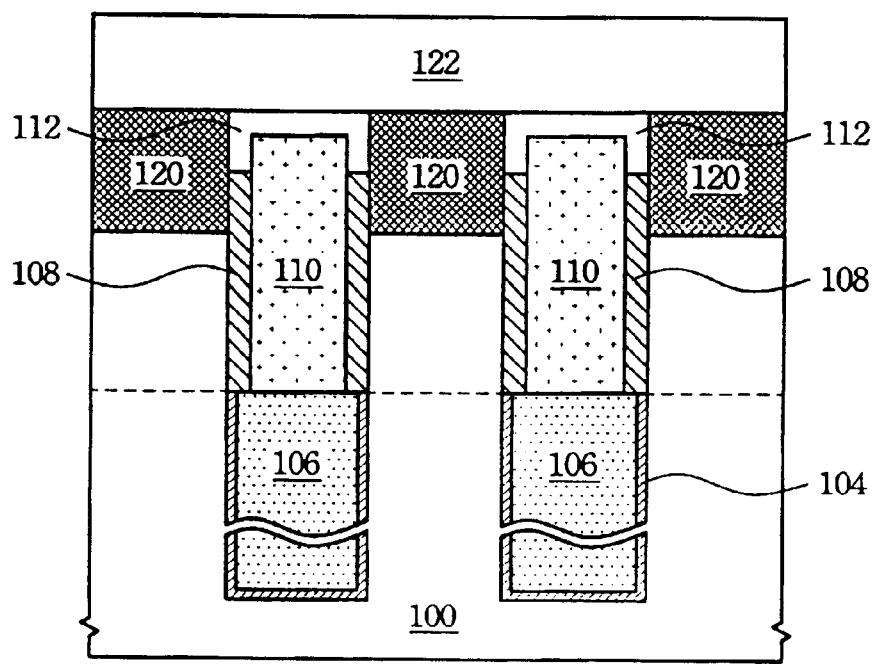
FIG. 6 is a cross-sectional diagram illustrating a process of forming the polysilicon layer according to an embodiment of the present invention.
Figure 7:
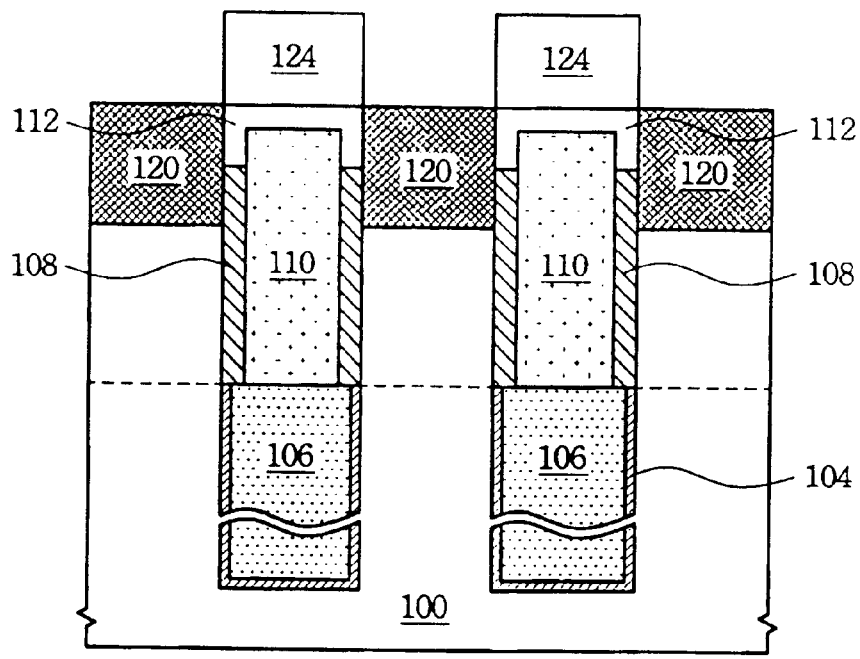
FIG. 7 is a cross-sectional diagram illustrating a process of forming an array device polysilicon layer of the array device active area according to an embodiment of the present invention.

Referring now to FIG. 6, a conventional CVD process or a conventional epitaxy process is performed to deposit a polysilicon layer 122 on the semiconductor substrate 100 and the cell area. Next, the polysilicon layer 122 is removed via a conventional photolithography process and an anisotropic etching process to form an array device polysilicon layer 124, as shown in FIG. 7.

Figure 8:
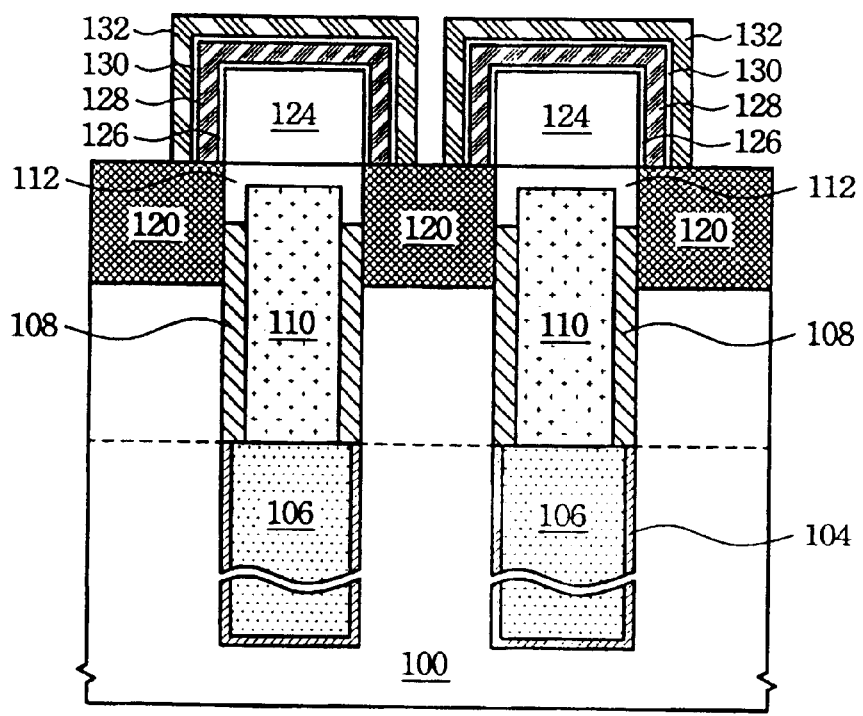
FIG. 8 is a cross-sectional diagram illustrating a process of forming the gate oxide layer, the gate conductive layer, the gate tungsten silicide layer and the gate nitride layer on the array device active area according to an embodiment of the present invention.

As shown in FIG. 8, an array device is formed on the cell area by performing the following steps. First, an oxide layer, a polysilicon/tungsten-silicide layer, and a nitride layer are subsequently formed on the semiconductor substrate 100 and the cell area. Next, a photolithography process and an anisotropic etching process are performed to remove the horizontal portions of the oxide layer, the polysilicon/tungsten-silicide layer and the nitride layer on the substrate surface to form a gate oxide layer 126, a gate polysilicon layer 128, a gate tungsten silicide layer 130 and a gate cap layer 132.

Figure 9:
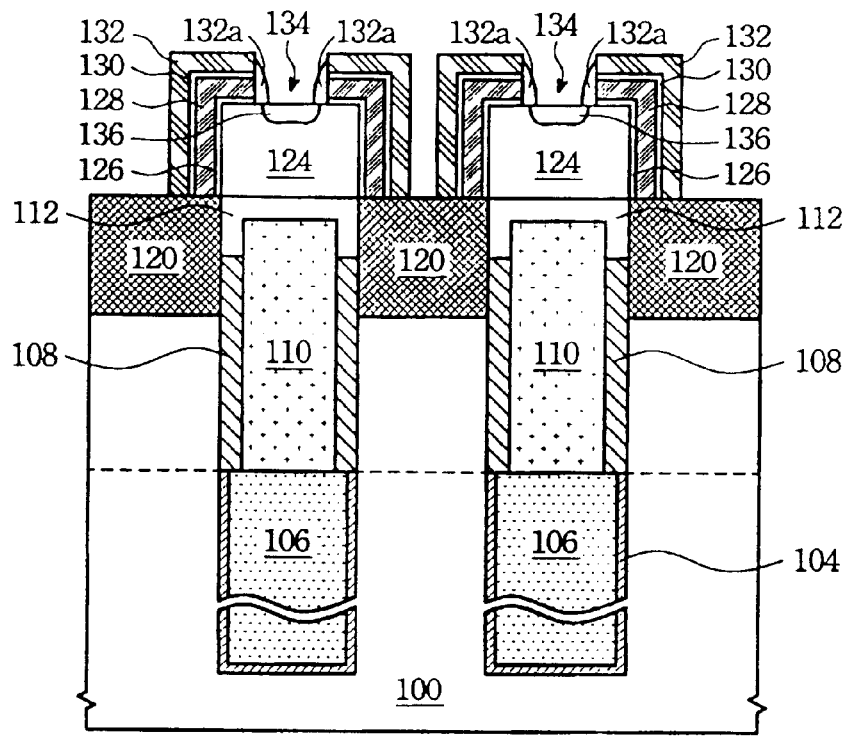
FIG. 9 is a cross-sectional diagram illustrating a process of forming the doping area through the contact window according to an embodiment of the present invention.

Next shown in FIG. 9, a conventional photolithography process and an anisotropic etching process are performed to form a contact window 134 on the top of the array device polysilicon layer 124. An ion implantation process is performed to introduce dopant ions through the contact window 134 to form doping area 136 (e.g., doped with As or P). To avoid contact plug and gate conductive layer short, an insulating spacer 132a (e.g., silicon oxide) is formed on sidewall of the gate oxide layer 126, the gate conductive layer 128 and 130 and the gate cap layer 132 and adjacent to a contact plug 138 (see FIG. 10) in the contact window 134. The insulation spacer forming process comprises following steps: the insulation layer is deposited with a CVD procedure and then an anisotropic etching process is applied to remove the horizontal portion of the insulation layer on the surface of the array device polysilicon layer 124 (or the doping area 136 as shown), leaving the insulating spacer 132a.

Figure 10:
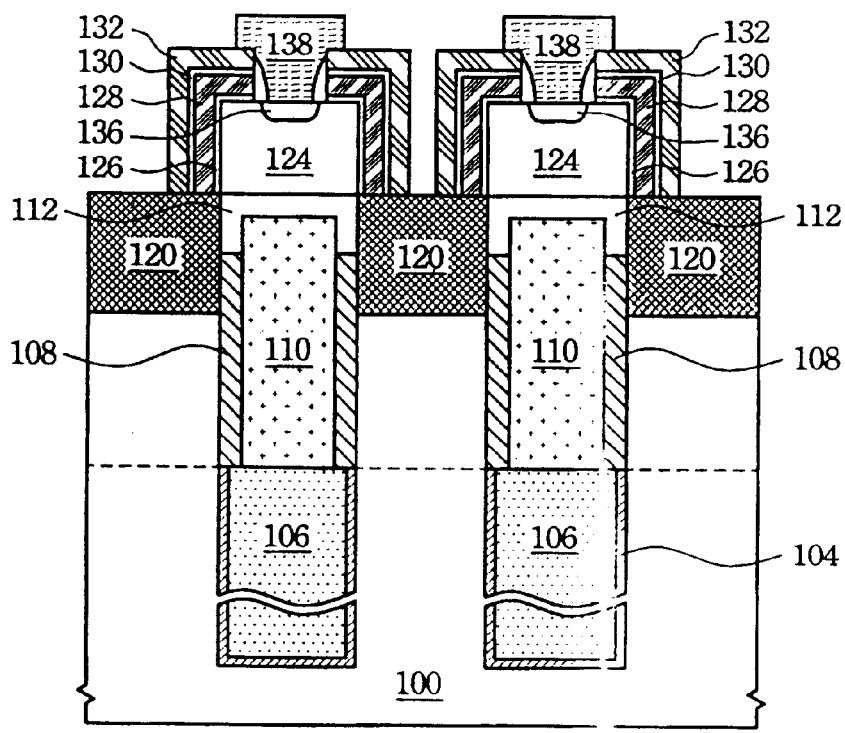
FIG. 10 is a cross-sectional diagram illustrating a process of forming double cell density in SDRAM and in DDR SDRAM according to an embodiment of the present invention.

As shown in FIG. 10, a polysilicon layer is formed on the semiconductor substrate 100 and cell area via a CVD process. The polysilicon layer is partially removed via a photolithography process and an anisotropic etching process to form the contact plug 138 in the contact window 134. This completes the formation of the double cell density in SDRAM or DDR SDRAM.

The exemplary embodiment of the device having double cell density in SDRAM and in DDR SDRAM is described as follows. As shown in FIG. 10, the SDRAM or DDR SDRAM with double cell density is set on the cell area of a semiconductor substrate. STIs are formed beside the array device active area in the semiconductor substrate. Each SDRAM or DDR SDRAM contains a trench capacitor and an array device. Particularly, the array device comprises an array device polysilicon layer 124, a gate oxide layer 126, a gate conductive layer 128 and 130, a gate cap 132, and a contact plug 138.

More particularly, as shown as FIG. 10, the trench capacitor is set in the array device active area of the semiconductor substrate. In other words, the upper edge or level of the trench capacitor substantially coincides with that of the substrate. Furthermore, the trench capacitor contains a deep trench, an oxide-nitride layer 104, a first polysilicon layer 106, an oxide layer 108, a second polysilicon layer 110, and a buried strap 112. Particularly, the deep trench is provided in the array device active area of the semiconductor substrate. The first oxide layer 104 is formed along the bottom and sidewall of the lower portion of the deep trench. In one embodiment, the oxide-nitride layer 104 is formed in the lower half of the deep trench. The lower portion (e.g., lower half) of the deep trench is then filled with the first polysilicon layer 106 and the first polysilicon layer 106 is surrounded by the first oxide layer 104. The oxide layer 108 formed along the upper portion (e.g., upper half) sidewall of the deep trench is set on the first oxide layer 104 and the part of the first polysilicon layer 106. After that, the second polysilicon layer 110 surrounded by the oxide layer 108 is connected to the top of the first polysilicon layer 106. More particularly, the upper edge or level of the second polysilicon layer 106 is higher than that of the oxide layer 108. The buried strap 112 which fills in the rest of the deep trench is set on the oxide layer 108 and the second polysilicon layer 110. The upper edge or level of buried strap 112 substantially coincides with that of said semiconductor substrate 100.

In the vertical MOS device, the trench capacitor of the cell area is covered with an array device polysilicon layer 124 of the array device active area. The gate oxide layer 126 with a thickness of typically between about 50 and about 80 Angstroms is set upon the array device polysilicon layer 124 of the array device active area. The gate conductive layer comprised of polysilicon 128 and tungsten-silicide 130 is then formed to a thickness of typically between about 600 and about 1200 Angstroms upon the gate oxide 126. Finally, the gate conductive layer 128 and 130 is connected to the gate cap 132, which typically contains a gate nitride layer. The thickness of the tungsten silicide layer 130 is typically between about 400 and about 700 Angstroms and that of the gate nitride layer is typically between about 1800 and about 2500 Angstroms. An insulating spacer 132a deposited on the sidewall of the gate oxide layer 126, the gate conductive layer 128 and 130, and the gate cap layer 132, and adjacent to the contact plug 138.

The contact plug 138 comprised of polysilicon is deposited on the array device polysilicon layer 124 of the array device active area. The bottom of the contact plug 138 connects the array device polysilicon 124 of the array device active area and also tunnels the gate oxide layer 126, the gate conductive layer 128 and 130, and the gate cap 132.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claim is:

1. A method for providing double: cell density in Synchronous Dynamic Random Access Memory (SDRAM) or Double Data Rate Synchronous Dynamic Random Access Memory (DDR SDRAM), the method comprising:
   providing a semiconductor substrate having a cell area on said semiconductor substrate, said cell area having an array device active area thereon;
   forming a trench capacitor in said array device active area;
   forming trench isolations beside said array device active area;
   forming an array device polysilicon layer above said trench capacitor in said array device active area;
   forming a gate oxide layer, a gate conductive layer and a gate cap on said array device polysilicon layer;
   forming a contact window on said array device polysilicon layer and a doping area in a top portion of said array device polysilicon layer; and
   forming a contact plug in said contact window.

2. The method according to claim 1, wherein forming said gate oxide layer, said gate conductive layer and said gate cap comprises:
   thermal oxidizing an oxide layer, depositing a conductive layer and a gate cap on said semiconductor substrate and vertically removing horizontal portions of said oxide layer, said conductive layer and said gate cap on said trench isolations.

3. The method according to claim 2, wherein the horizontal portions of said oxide layer, said conductive layer and said gate cap are vertically removed by a lithography process and an anisotropic etching process.

4. The method according to claim 2, wherein said conductive layer comprises a polysilicon and a tungsten suicide layer.

5. The method according to claim 2, wherein said gate cap comprises a nitride layer.

6. The method according to claim 1, wherein forming said contact window comprises forming an insulating spacer on a sidewall of said gate oxide layer, said gate conductive layer and said gate cap layer.

7. The method according claim 1, wherein forming said trench capacitor comprises:
   forming a trench in said array device active area;
   forming an oxide-nitride layer along a bottom and a sidewall in a lower portion of said trench;
   forming a doped first polysilicon layer in said trench, wherein said doped first polysilicon layer is surrounded by said first oxide layer in said trench;

depositing an oxide layer on said oxide-nitride layer and on said first polysilicon layer and removing a horizontal portion of said oxide layer to form a second oxide layer along a sidewall in an upper portion of said trench;

forming a doped second polysilicon layer, wherein said doped second polysilicon layer is surrounded by said oxide layer in said trench; and forming a buried strap on said second oxide layer and said second polysilicon layer.

8. The method according to claim 7, wherein said trench is a deep trench formed in said array device active area by an anisotropic etching process.

9. The method according to claim 7, wherein said first polysilicon layer is more heavily doped than said second polysilicon layer.

10. The method according to claim 7, wherein said first polysilicon layer is heavily doped with about 5E12 $cm^{-2}$–6E15 $cm^{-2}$ dopant.

11. The method according to claim 7, wherein said second polysilicon layer is lightly doped with about 1E11 $cm^{-2}$–5E13 $cm^{-2}$ dopant.

12. The method according to claim 7, wherein the horizontal portion of said oxide layer is removed by an anisotropic etching process to form said second oxide layer.

13. The method according to claim 7, wherein said doped second polysilicon layer is formed by a chemical vapor deposition (CVD) process and etching back said polysilicon layer.

14. The method according to claim 7, wherein said oxide-nitride layer is formed by depositing a nitride layer then oxidizing said nitride layer.

15. The method according to claim 1, wherein forming said contact plug comprises forming a polysilicon layer on said semiconductor substrate and cell area, then forming said contact plug in a lithography process and an anisotropic etching process.

16. The method according to claim 1, wherein said array device polysilicon layer is formed above said array device active area by depositing a polysilicon layer on said semiconductor substrate and then performing a lithography process and an anisotropic etching process.

17. The method according to claim 1, wherein said trench isolations comprise shallow trench isolations (STIs).

18. The method of claim 1 wherein said doping area in the top portion of said array device polysilicon layer is doped with As or P.

19. The method of claim 18, wherein said doping area is doped with As or P by ion implantation.

20. The method of claim 7 wherein said buried strap comprises a doped polysilicon layer.

21. The method of claim 20 wherein said doped polysilicon layer is doped with As or P.

* * * * *